(12) United States Patent
Buchanan

(10) Patent No.: US 9,837,154 B2
(45) Date of Patent: Dec. 5, 2017

(54) RESISTIVE RANDOM ACCESS MEMORY (RRAM) SYSTEM

(71) Applicant: Hewlett Packard Enterprise Development LP, Houston, TX (US)

(72) Inventor: Brent Buchanan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,472

(22) PCT Filed: Apr. 15, 2015

(86) PCT No.: PCT/US2015/025860
§ 371 (c)(1),
(2) Date: Jan. 30, 2017

(87) PCT Pub. No.: WO2016/167756
PCT Pub. Date: Oct. 20, 2016

(65) Prior Publication Data
US 2017/0221562 A1   Aug. 3, 2017

(51) Int. Cl.
*G11C 13/00* (2006.01)

(52) U.S. Cl.
CPC ...... *G11C 13/0069* (2013.01); *G11C 13/0097* (2013.01); *G11C 2013/0078* (2013.01)

(58) Field of Classification Search
None
See application file for complete search history.

(56) References Cited

U.S. PATENT DOCUMENTS

| | | | |
|---|---|---|---|
| 7,869,268 B2 * | 1/2011 | Giovinazzi | G11C 13/0004 365/148 |
| 8,031,516 B2 | 10/2011 | Tang | |
| 8,194,434 B2 | 6/2012 | Toda | |
| 8,520,431 B2 * | 8/2013 | Di Vincenzo | G11C 13/0064 365/148 |
| 8,625,361 B2 * | 1/2014 | Chiu | G11C 8/16 365/189.04 |
| 8,942,024 B2 * | 1/2015 | Huang | G11C 13/0069 365/148 |
| 9,286,976 B2 * | 3/2016 | Lin | G11C 13/004 |

(Continued)

OTHER PUBLICATIONS

International Searching Authority, The International Search Report and the Written Opinion, PCT/US2015/025860, Jan. 15, 2016, 11 Pages.

(Continued)

*Primary Examiner* — Son Mai
(74) *Attorney, Agent, or Firm* — Tarolli, Sundheim, Covell & Tummino L.L.P.

(57) ABSTRACT

One example includes a resistive random access memory (RRAM) system. The system includes a resistive memory element to store a binary state based on a resistance of the resistive memory element. The system also includes an RRAM write circuit to generate a current through the resistive memory element to provide a write voltage across the resistive memory element to set the resistance of the resistive memory element. The system further includes a write shutoff circuit to monitor a change in the write voltage as a function of time to deactivate the RRAM write circuit in response to a change in the binary state of the resistive memory element.

15 Claims, 3 Drawing Sheets

(56) References Cited

U.S. PATENT DOCUMENTS

| | | |
|---|---|---|
| 2006/0007769 A1 | 1/2006 | Rinerson et al. |
| 2010/0214819 A1 | 8/2010 | Kim et al. |
| 2012/0320660 A1 | 12/2012 | Nazarian et al. |
| 2013/0250657 A1 | 9/2013 | Haukness et al. |
| 2014/0169069 A1 | 6/2014 | Oh |
| 2014/0233331 A1 | 8/2014 | Foong et al. |
| 2014/0340959 A1 | 11/2014 | Antonyan |
| 2015/0064873 A1 | 3/2015 | Barabash et al. |

OTHER PUBLICATIONS

Zheng, T., et al., Variable-energy Write STT-RAM Architecture with Bit-wise Write-completion Monitoring [online], Oct. 25, 2013, Retrieved Mar. 11, 2015, 6 Pgs.

\* cited by examiner

RESISTIVE RANDOM ACCESS MEMORY (RRAM) SYSTEM

BACKGROUND

Resistive random access memory (RRAM) devices are being implemented in a variety of circuit devices to provide a manner to store data. RRAM devices, such as memristors, implement data storage based on setting a resistance of the RRAM device in response to applying a stimulus (e.g., a voltage) during a write operation. The resistance of the RRAM device thus changes in response to the applied write stimulus to set a given binary state of the RRAM device, and thus allows the binary state of the device to be read based on the magnitude of the resistance. Significant improvements in RRAM device characteristics (e.g., endurance, retention, and read margin) and power savings have been obtained by terminating the write stimulus as soon as the binary state of the RRAM device changes.

DETAILED DESCRIPTION

Figure 1:
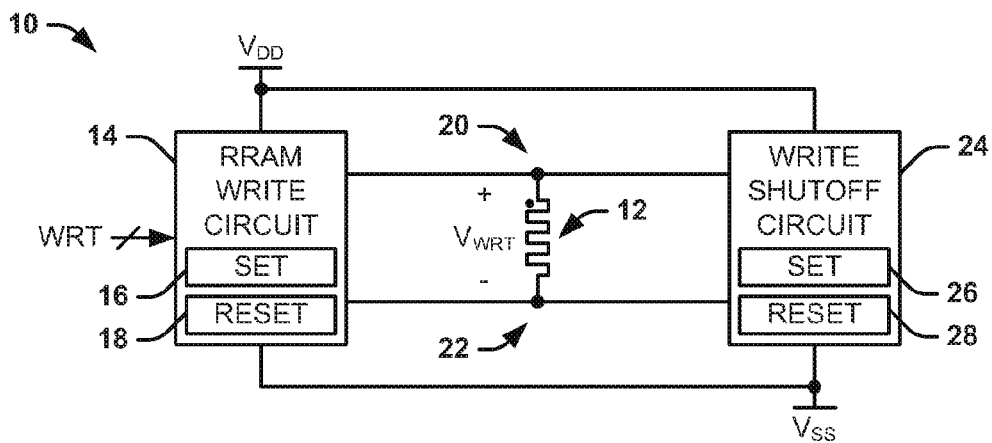
FIG. 1 illustrates an example of an RRAM system.

FIG. 1 illustrates an example of a resistive random access memory (RRAM) system 10. The RRAM system 10 can be used in a variety of computer applications, such as to store data or for display devices. The RRAM system 10 includes a resistive memory element 12 that is configured to store a binary state that corresponds to a magnitude of a resistance across the resistive memory element 12. As an example, the resistive memory element 12 can be configured as a memristor. The RRAM system 10 includes an RRAM write circuit 14 configured to set the magnitude of the resistance across the resistive memory element 12 by applying a write stimulus to the resistive memory element 12, demonstrated in the example of FIG. 1 as a write voltage $V_{WRT}$, in response to one or more write signals WRT that can be provided to initiate a write operation. In the example of FIG. 1, the write voltage $V_{WRT}$ can be generated based on a power voltage rail $V_{DD}$ with reference to a low voltage rail $V_{SS}$, which could be ground, for example.

As an example, the resistive memory element 12 can be configured as a bipolar resistive memory element 12, such that the resistive memory element 12 is configured to store a first binary state (e.g., a set condition) in response to application of the write voltage $V_{WRT}$ in a first polarity, and is configured to store a second binary state (e.g., a reset condition) in response to application of the write voltage $V_{WRT}$ in a second polarity. Thus, in the example of FIG. 1, the RRAM write circuit 14 includes a set portion 16 and a reset portion 18. Thus, the set portion 16 can be configured to apply the write voltage $V_{WRT}$ on a node 20 relative to a node 22, with the nodes 20 and 22 being interconnected by the resistive memory element 12, to set the first binary state of the resistive memory element 12. Similarly, the reset portion 18 can be configured to apply the write voltage $V_{WRT}$ on the node 22 relative to the node 20 (e.g., a negative amplitude of the write voltage $V_{WRT}$ on the node 20 relative to the node 22) to set the second binary state of the resistive memory element 12.

Overwriting the resistive memory element 12, such as by applying the write voltage $V_{WRT}$ for longer than is necessary to change the binary state of the resistive memory element 12, can have a variety of deleterious effects. As an example, by applying the write voltage $V_{WRT}$ to the resistive memory element 12 for a duration of time after the resistive memory element 12 switches binary states, characteristics of the resistive memory element 12 can degrade, such as endurance, retention capability, and read margin (e.g., resistive changes in a given one of the binary states). Additionally, application of the write voltage $V_{WRT}$ after the change of the binary state of the resistive memory element $V_{WRT}$ unnecessarily consumes power, thus resulting in power loss.

To substantially mitigate overwriting the resistive memory element 12, the RRAM system 10 includes a write shutoff circuit 24. The write shutoff circuit 24 is configured to monitor a change in the write voltage $V_{WRT}$ as a function of time ($dV_{WRT}/dt$). In response to a given change in the write voltage $V_{WRT}$ as a function of time that is indicative of a change of state of the resistive memory element 12, the write shutoff circuit 24 is configured to deactivate the RRAM write circuit 14 to terminate a respective write operation. For example, subsequent to application of the write voltage $V_{WRT}$ to the resistive memory element 12, the resistive memory element 12 can be configured to rapidly change a resistance magnitude, thus indicating the change in the binary state. Therefore, the write shutoff circuit 24 can be configured to detect the rapid change in the resistance magnitude of the resistive memory element 12 based on a rapid change in the write voltage $V_{WRT}$, and can thus deactivate the RRAM write circuit 14 substantially immediately in response to the rapid change in the write voltage $V_{WRT}$.

In the example of FIG. 1, the write shutoff circuit 24 includes a set portion 26 and a reset portion 28. The set portion 26 can be configured to monitor the write voltage $V_{WRT}$ on the node 20 relative to the node 22, and can substantially immediately deactivate the set portion 16 of the RRAM write circuit 14 in response to a sufficiently rapid change of the write voltage $V_{WRT}$ (e.g., sufficient $dV_{WRT}/dt$) that indicates the change of the binary state of the resistive memory element 12 from a first state to a second state. The reset portion 28 can be configured to monitor the write voltage $V_{WRT}$ on the node 22 relative to the node 20, and can substantially immediately deactivate the reset portion 18 of the RRAM write circuit 14 in response to a sufficiently rapid change of the write voltage $V_{WRT}$ (e.g., sufficient $dV_{WRT}/dt$) that indicates the change of the binary state of the resistive memory element 12 from the second state to the first state. As an example, each of the set portion 26 and the reset portion 28 of the write shutoff circuit 24 can include a capacitor that is conductively coupled to the resistive memory element 12, such as via the respective nodes 20 and 22, and each of the set portion 16 and the reset portion 18 of the RRAM write circuit 14 can include a switch configured to provide a current through the resistive memory element 12 to provide the write voltage $V_{WRT}$. Therefore, in response to the rapid change of the write voltage $V_{WRT}$, the respective capacitor can generate a current pulse that controls a substantially immediate cut-off of the respective switch that provides the current through the resistive memory element 12, thus terminating the write operation. Accordingly, the write shutoff circuit 24 can substantially immediately terminate the write operation in response to the change of the binary state of the resistive memory element 12 to substantially mitigate overwriting of the resistive memory element 12.

It is to be understood that the RRAM system 10 is not limited to the example of FIG. 1. As an example, the RRAM system 10 demonstrates only write circuit components in the example of FIG. 1 for the sake of simplicity, but it is to be understood that the RRAM system 10 can also include read circuit components to read the binary state of the resistive memory element 12. In addition, while the resistive memory element 12 is described as being bipolar, it is to be understood that the RRAM system 10 can instead include one or more unipolar resistive memory elements. Therefore, the RRAM system 10 can be configured in a variety of ways.

Figure 2:
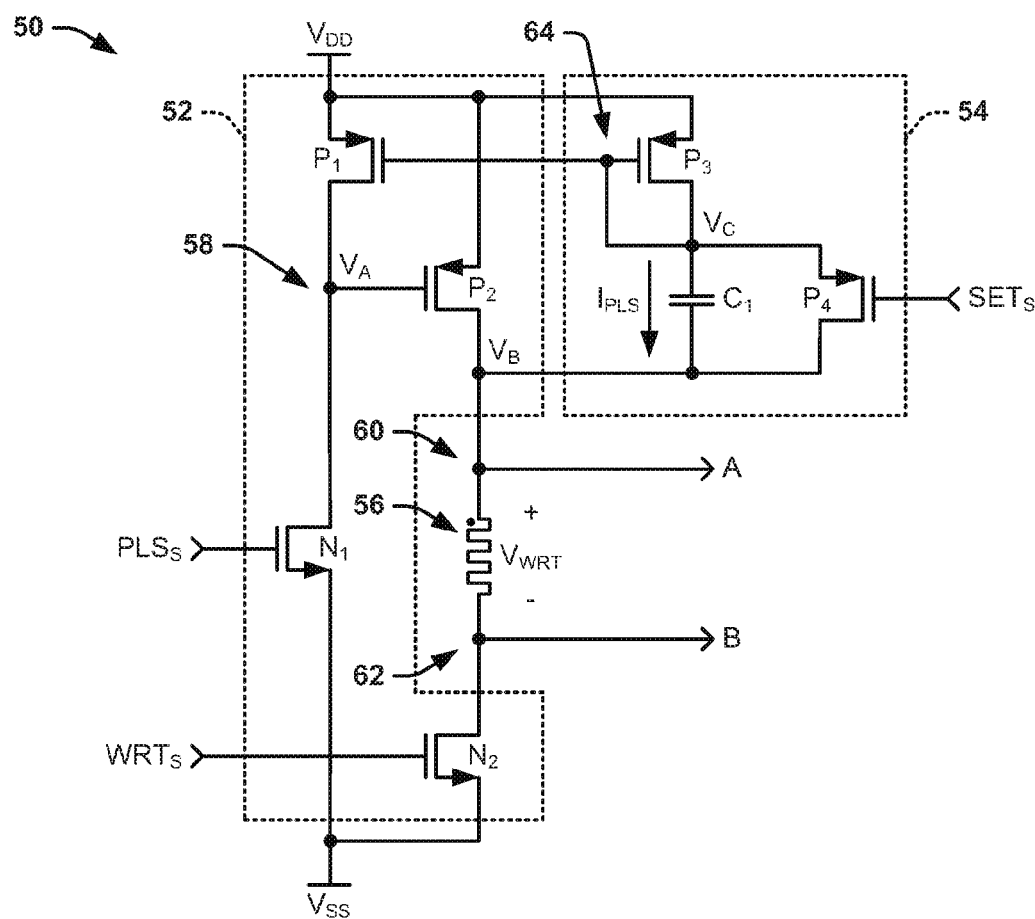
FIG. 2 illustrates an example of an RRAM circuit.

FIG. 2 illustrates an example of an RRAM circuit 50. The RRAM circuit 50 includes a write circuit set portion 52 and a write shutoff set portion 54. The write circuit set portion 52 can correspond to the set portion 16 of the RRAM write circuit 14, and the write shutoff set portion 54 can correspond to the set portion 26 of the write shutoff circuit 24. The RRAM write circuit 50 is thus implemented for setting the binary state of a resistive memory element 56 from a first state to a second state, as described herein, based on the write voltage $V_{WRT}$ provided at a first polarity. Therefore, reference is to be made to the example of FIG. 1 in the following description of the example of FIG. 2. Additionally, as described in greater detail herein, the resistive memory element 56 can also be coupled to reset portions of each of the RRAM write circuit 14 and the write shutoff circuit 24.

The write circuit set portion 52 includes a P-channel metal-oxide semiconductor field-effect transistor (MOSFET, hereinafter "FET") $P_1$ having a source that is coupled to the power rail voltage $V_{DD}$ and a drain that is coupled to a node 58. The write circuit set portion 52 also includes a P-FET $P_2$ that interconnects the power rail voltage $V_{DD}$ and the resistive memory element 56, with the source of the P-FET $P_2$ being coupled to the power rail voltage $V_{DD}$ and the drain being coupled to a node 60. The gate of the P-FET $P_2$ is coupled to the node 58 having a voltage $V_A$, with the node 60 having a voltage $V_B$. The write circuit set portion 52 also includes an N-channel FET $N_1$ that interconnects the node 58 at a drain and the low voltage rail $V_{SS}$ at a source, and which has a gate that is controlled by a signal $PLS_S$ that is provided during a write operation. The write circuit set portion 52 further includes an N-FET $N_2$ that interconnects the resistive memory element 56 via a node 62 at a drain and the low voltage rail $V_{SS}$ at a source, and which has a gate that is controlled by a write signal $WRT_S$ that is provided during the write operation. In the example of FIG. 2, the nodes 60 and 62 are labeled as "A" and "B" to indicate coupling to reset portions of each of the RRAM write circuit 14 and the write shutoff circuit 24, such that the resistive memory element 56 is likewise coupled to the reset portions of each of the RRAM write circuit 14 and the write shutoff circuit 24.

The write shutoff set portion 54 includes a P-FET $P_3$ having a source that is coupled to the power rail voltage $V_{DD}$, and which has a gate and drain that are coupled together at a node 64 having a voltage $V_C$. The node 64 is also coupled to a gate of the P-FET $P_1$, such that the P-FETs $P_1$ and $P_3$ are arranged as a current mirror. Thus, the P-FET $P_3$ is configured to conduct current concurrently with the P-FET $P_1$ in a proportional manner. The write shutoff set portion 54 also includes a P-FET $P_4$ that interconnects the node 64 at a source and the node 60 at a drain, with a gate that is controlled by a set signal $SET_S$ that is provided during the write operation. The write shutoff set portion 54 further includes a capacitor $C_1$ that likewise interconnects the nodes 60 and 64. As described herein, the capacitor $C_1$ is configured to react to a change in the write voltage $V_{WRT}$ over time ($dV_{WRT}/dt$) to provide deactivation of the write circuit set portion 52.

To implement a write operation, the set signal $SET_S$ can be asserted from a logic-low state to a logic-high state to deactivate the P-FET $P_4$. As a result, a conductive path between the nodes 64 and 60 through the P-FET $P_4$ is cut-off, and the capacitor $C_1$ is enabled to conduct current from the node 64 to the node 60. In addition, the signals $PLS_S$ and $WRT_S$ are also both asserted from a logic-low state to a logic-high state to activate the respective N-FETs $N_1$ and $N_2$. The N-FET $N_1$ pulls the voltage $V_A$ down to approximately the voltage $V_{SS}$ to activate the P-FET $P_2$. The N-FET $N_2$ thus provides a current path from the positive rail voltage $V_{DD}$ through the activated P-FET $P_2$, through the resistive memory element 56, and through the activated N-FET $N_2$ to the low voltage rail $V_{SS}$. As a result, the write voltage $V_{WRT}$ is provided across the resistive memory element 56.

In addition, because the voltages $V_A$ and $V_B$ are pulled down via the activation of the N-FETs $N_1$ and $N_2$, respectively, the capacitor $C_1$ builds a charge via a current through the P-FET $P_3$ to provide a voltage difference between the voltages $V_C$ and $V_B$. Thus, while the N-FET $N_1$ is activated, the P-FETs $P_1$ and $P_3$ conduct a current that is provided to through the capacitor $C_1$ to allow the voltage $V_B$ to settle to a voltage that is less than the positive rail voltage $V_{DD}$. As an example, the signal $PLS_S$ can be a pulsed signal, such that the signal $PLS_S$ can be de-asserted from the logic-high state to the logic-low state at a predetermined time later, such as after the charge across the capacitor $C_1$ settles and the voltages $V_B$ and $V_C$ stabilize, to deactivate the N-FET $N_1$. The P-FETs $P_1$ and $P_3$ likewise deactivate in response to the setting of the voltages $V_B$ and $V_C$. The low voltage amplitude of the voltage $V_A$ can be stored in the parasitic gate capacitance of the P-FET $P_2$ subsequent to deactivation of the N-FET $N_1$ to maintain activation of the P-FET $P_2$. Therefore, the write voltage $V_{WRT}$ is maintained across the resistive memory element 56 subsequent to deactivation of the N-FET $N_1$.

At a subsequent time, the resistance of the resistive memory element 56 changes rapidly from a high-resistance state to a low-resistance state (e.g., is "set") to indicate the change in the binary state of the resistive memory element 56. In the low-resistance state, more current flows through the resistive memory element 56 as well as through the P-FET $P_2$ and the N-FET $N_2$, with the greater current causing a greater voltage drop across the channel of the P-FET $P_2$, and as a result, the write voltage $V_{WRT}$ likewise rapidly decreases, which causes the voltage $V_B$ at the node 60 to also rapidly decrease. Therefore, the write voltage $V_{WRT}$ experiences a rapid change in amplitude over time ($dV_{WRT}/dt$), which is detected by the write shutoff set portion 54. In the example of FIG. 2, the rapid decrease of the voltage $V_B$ causes the capacitor $C_1$ to generate a current pulse $I_{PLS}$. The current pulse $I_{PLS}$ can thus pull the voltage $V_C$ down to activate the P-FETs $P_1$ and $P_3$. The activation of the P-FET $P_1$ via the decrease of the voltage $V_C$ at the node 64 causes the voltage $V_A$ to be pulled up to approximately the amplitude of the positive rail voltage $V_{DD}$. Accordingly, the P-FET $P_2$ is deactivated to cease the current flow through the resistive memory element 56, and thus to cease the application of the write voltage $V_{WRT}$ to terminate the write operation. At a subsequent time later, the signals $WRT_S$ and $SET_S$ can be de-asserted to deactivate the N-FET $N_2$ and to activate the P-FET $P_4$, thus allowing the capacitor $C_1$ to discharge and returning the RRAM circuit 50 to return to a resting state.

Accordingly, the write shutoff set portion 54 detects the rapid change in the write voltage $V_{WRT}$ resulting from the change in the binary state of the resistive memory element 56, and responds by substantially immediately deactivating the P-FET $P_2$ to terminate the write operation. By detecting the change in the write voltage $V_{WRT}$ as a function of time, the RRAM circuit 50 can substantially immediately and efficiently terminate a write operation to substantially mitigate an overwrite condition. For example, the RRAM circuit 50 can terminate the write operation in a manner that is more efficient than a typical write shutoff circuit that can implement additional circuitry to generate a reference voltage. In other words, for typical shutoff circuits that implement comparison of the write voltage across the resistive memory element for shutoff, it can be difficult to predict an accurate amplitude for a sufficient reference voltage for shutoff, and generating and distributing the reference voltage can require additional circuitry that adds additional cost, circuit area, and power consumption. Additionally, the reference voltage can often drift in amplitude, and requires a feedback loop to implement the shutoff, which can add additional time to terminate the write operation, thus resulting in application of the write voltage $V_{WRT}$ for longer than may be necessary to change the state of the resistive memory element. Accordingly, the RRAM circuit 50 implements a much more rapid and efficient manner of terminating the write operation of the resistive memory element 56 than a typical RRAM write system.

Figure 3:
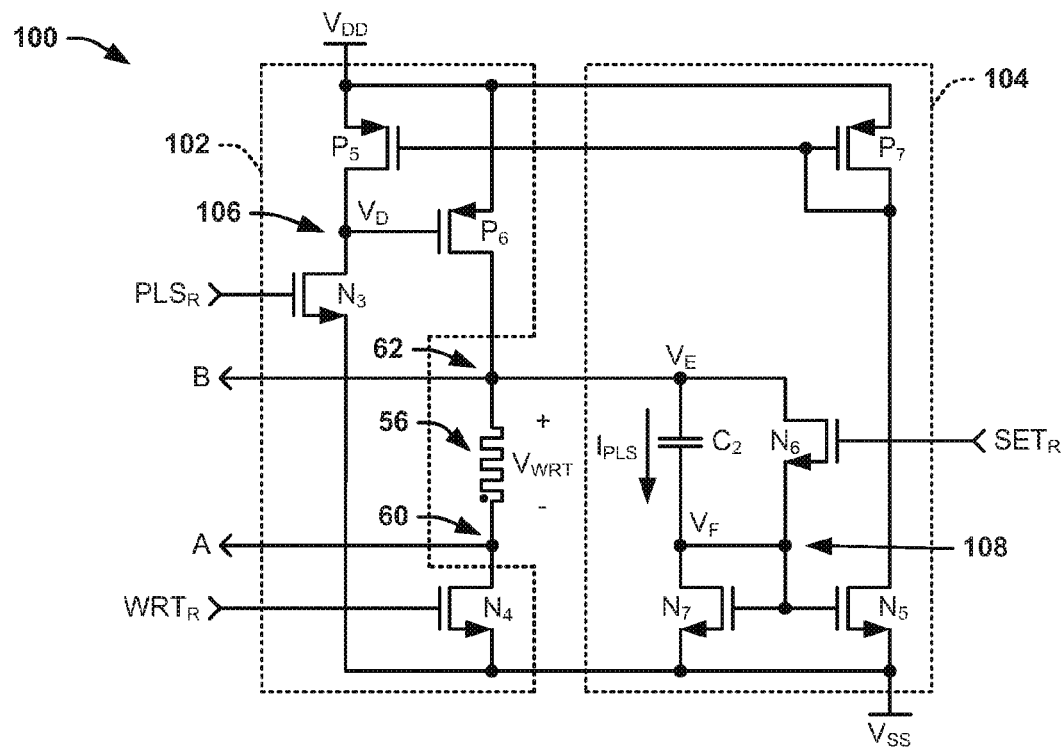
FIG. 3 illustrates another example of an RRAM circuit.

FIG. 3 illustrates an example of an RRAM circuit 100. The RRAM circuit 100 includes a write circuit reset portion 102 and a write shutoff reset portion 104. The write circuit reset portion 102 can correspond to the reset portion 18 of the RRAM write circuit 14, and the write shutoff reset portion 104 can correspond to the set portion 28 of the write shutoff circuit 24. The RRAM write circuit 100 is thus implemented for setting the binary state of the resistive memory element 56 from the second state to the first state, as described herein, based on the write voltage $V_{WRT}$ provided at a second polarity. Additionally, as described herein, the resistive memory element 56 is coupled to the write circuit set portion 52 and the write shutoff set portion 54 of the respective RRAM write circuit 14 and the write shutoff circuit 24 via the nodes 60 and 62. Therefore, reference is to be made to the examples of FIGS. 1 and 2 in the following description of the example of FIG. 3. In addition, it is to be noted that, in the examples of FIGS. 2 and 3, the resistive memory element 56 is demonstrated as a bipolar resistive memory element 56, such that the polarity of the resistive memory element 56 is reversed with respect to the arrangement between the rail voltages $V_{DD}$ and $V_{SS}$, and thus the write voltage $V_{WRT}$ has an opposite polarity for resetting the binary state of the resistive memory element 56 in the example of FIG. 3 relative to the setting of the binary state in the example of FIG. 2.

The write circuit reset portion 102 includes a P-FET $P_5$ having a source that is coupled to the power rail voltage $V_{DD}$ and a drain that is coupled to a node 106. The write circuit reset portion 102 also includes a P-FET $P_6$ that interconnects the power rail voltage $V_{DD}$ and the resistive memory element 56, with the source of the P-FET $P_6$ being coupled to the power rail voltage $V_{DD}$ and the drain being coupled to the node 62. The gate of the P-FET $P_6$ is coupled to the node 106 having a voltage $V_D$, with the node 62 having a voltage $V_E$. The write circuit reset portion 102 also includes an N-channel FET $N_3$ that interconnects the node 106 at a drain and the low voltage rail $V_{SS}$ at a source, and which has a gate that is controlled by a signal $PLS_R$ that is provided during a write operation. The write circuit reset portion 102 further includes an N-FET $N_4$ that interconnects the resistive memory element 56 via a node 60 at a drain and the low voltage rail $V_{SS}$ at a source, and which has a gate that is controlled by a write signal $WRT_R$ that is provided during the write operation. As described previously in the example of FIG. 2, the nodes 60 and 62 are labeled as "A" and "B" to indicate coupling to the write circuit set portion 52 and the write shutoff set portion 54 in the example of FIG. 2.

The write shutoff reset portion 104 includes a P-FET $P_7$ having a source that is coupled to the power rail voltage $V_{DD}$, and which has a gate and drain that are coupled together, and which are coupled to a gate of the P-FET $P_5$, such that the P-FETs $P_5$ and $P_7$ are arranged as a current mirror. Thus, the P-FET $P_7$ is configured to conduct current concurrently with the P-FET $P_5$ in a proportional manner. The gate/drain of the P-FET $P_7$ is also coupled to a drain of an N-FET $N_5$ that interconnects the P-FET $P_7$ and the low voltage rail $V_{SS}$. The write shutoff reset portion 104 also includes an N-FET $N_6$ that interconnects the node 62 at a source and a node 108 having a voltage $V_F$ at a drain, with a gate that is controlled by a set signal $SET_R$ that is provided during the write operation. The node 108 is coupled to gates of the N-FET $N_5$ and an N-FET $N_7$, with each of the N-FETs $N_5$ and $N_7$ having sources coupled to the low-voltage rail $V_{SS}$ and the N-FET $N_7$ having a drain that is also coupled to the node 108, such that the N-FETs $N_5$ and $N_7$ are arranged as a current mirror. A capacitor $C_2$ interconnects the nodes 62 and 108. As described herein, the capacitor $C_2$ is configured to react to a change in the write voltage $V_{WRT}$ over time ($dV_{WRT}/dt$) to provide deactivation of the write circuit reset portion 102.

To implement a write operation, the set signal $SET_R$ can be de-asserted from a logic-high state to a logic-low state to deactivate the N-FET $N_6$. As a result, a conductive path between the nodes 62 and 108 through the N-FET $N_6$ is cut-off, and the capacitor $C_2$ is enabled to conduct current from the node 62 to the node 108. In addition, the signals $PLS_R$ and $WRT_R$ are also both asserted from a logic-low state to a logic-high state to activate the respective N-FETs $N_3$ and $N_4$. The N-FET $N_3$ pulls the voltage $V_D$ down to approximately the voltage $V_{SS}$ to activate the P-FET $P_6$. The N-FET $N_4$ thus provides a current path from the positive rail voltage $V_{DD}$ through the activated P-FET $P_6$, through the resistive memory element 56, and through the activated N-FET $N_4$ to the low voltage rail $V_{DD}$. As a result, the write voltage $V_{WRT}$ is provided across the resistive memory element 56.

In addition, because the P-FET $P_6$ is activated and providing the current through the resistive memory element 56, the voltage $V_E$ is increased, such that a portion of the current is provided through the capacitor $C_2$ to build a charge on the capacitor $C_2$ to provide a voltage difference between the voltages $V_E$ and $V_F$. As an example, the signal $PLS_R$ can be a pulsed signal, such that the signal $PLS_R$ can be de-asserted from the logic-high state to the logic-low state at a predetermined time later, such as after the charge across the capacitor $C_2$ settles and the voltages $V_E$ and $V_F$ stabilize, to deactivate the N-FET $N_3$. The low voltage amplitude of the voltage $V_D$ can be stored in the parasitic gate capacitance of the P-FET $P_6$ subsequent to deactivation of the N-FET $N_3$ to maintain activation of the P-FET $P_6$. Therefore, the write voltage $V_{WRT}$ is maintained across the resistive memory element 56 subsequent to deactivation of the N-FET $N_3$.

At a subsequent time, the resistance of the resistive memory element 56 changes rapidly from a low-resistance state to a high-resistance state (e.g., is "reset") to indicate the change in the binary state of the resistive memory element 56. As a result, the write voltage $V_{WRT}$ likewise rapidly increases, which causes the voltage $V_E$ at the node 62 to also rapidly increase. Therefore, the write voltage $V_{WRT}$ experiences a rapid change in amplitude over time ($dV_{WRT}/dt$), which is detected by the write shutoff reset portion 104. In the example of FIG. 3, the rapid increase of the voltage $V_E$ causes the capacitor $C_2$ to generate a current pulse $I_{PLS}$. The current pulse $I_{PLS}$ can thus pull the voltage $V_F$ up to activate the N-FETs $N_5$ and $N_7$. The current flow through the N-FET $N_7$ as a result of the activation of the N-FET $N_7$ is mirrored by the N-FET $N_5$, which decreases the voltage at the gates of the P-FETs $P_7$ and $P_5$ to activate the P-FETs $P_7$ and $P_5$. The activation of the P-FET $P_5$ causes the voltage $V_D$ to be pulled up to approximately the amplitude of the positive rail voltage $V_{DD}$. Accordingly, the P-FET $P_6$ is deactivated to cease the current flow through the resistive memory element 56, and thus to cease the application of the write voltage $V_{WRT}$ to terminate the write operation. At a subsequent time later, the write signal $WRT_R$ can be de-asserted and the set signal $SET_R$ can be asserted to deactivate the N-FET $N_4$ and to activate the N-FET $N_6$, thus allowing the capacitor $C_2$ to discharge and returning the RRAM circuit 100 to return to a resting state. As a result, similar to as described previously regarding the RRAM circuit 50 in the example of FIG. 2, the RRAM circuit 100 implements a much more rapid and efficient manner of terminating the write operation (e.g., of a reset write operation) of the resistive memory element 56 than a typical RRAM write system by detecting the change of the write voltage $V_{WRT}$ as a function of time, as opposed to comparing the write voltage $V_{WRT}$ to a reference voltage as provided in a typical write shutoff circuit.

Figure 4:
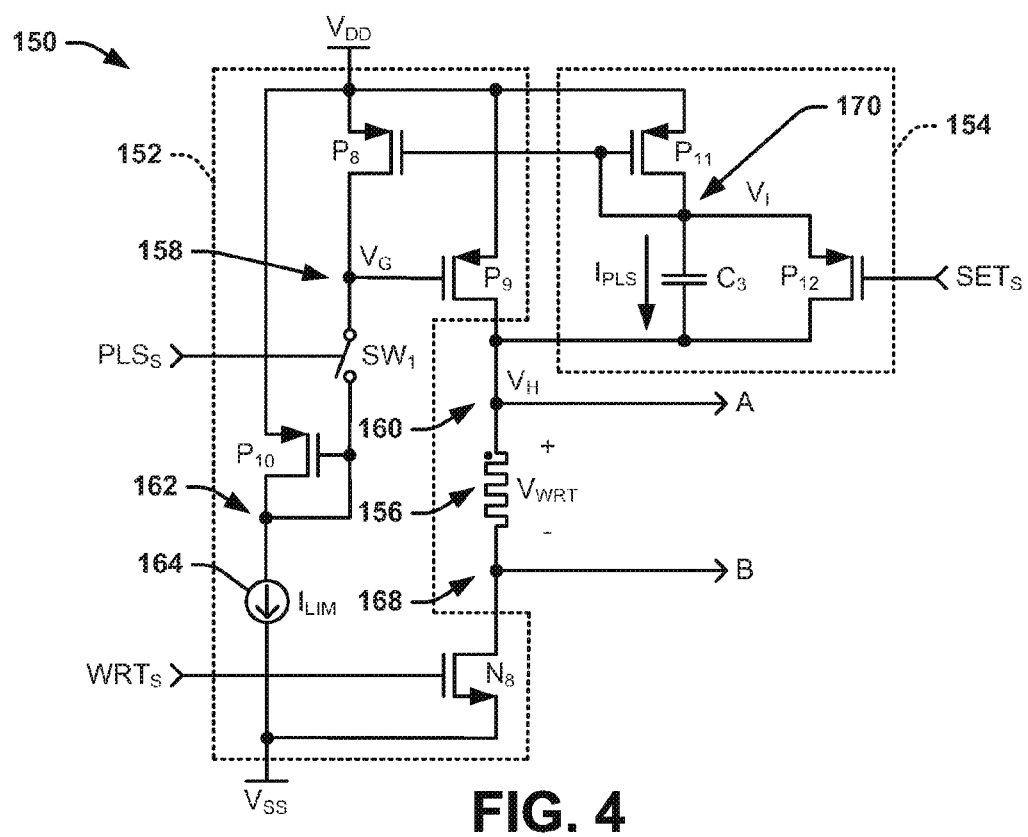
FIG. 4 illustrates yet another example of an RRAM circuit.

FIG. 4 illustrates yet another example of an RRAM circuit 150. The RRAM circuit 150 includes a write circuit set portion 152 and a write shutoff set portion 154. The write circuit set portion 152 can correspond to the set portion 16 of the RRAM write circuit 14, and the write shutoff set portion 154 can correspond to the set portion 26 of the write shutoff circuit 24. The RRAM write circuit 150 is thus implemented for setting the binary state of a resistive memory element 156 from a first state to a second state, as described herein, based on the write voltage $V_{WRT}$ provided at a first polarity. Therefore, reference is to be made to the example of FIG. 1 in the following description of the example of FIG. 4. Additionally, as described in greater detail herein, the resistive memory element 156 can also be coupled to reset portions of each of the RRAM write circuit 14 and the write shutoff circuit 24, such as the write circuit reset portion 102 and the write shutoff reset portion 104 in the example of FIG. 3. As described herein, the RRAM circuit 150 can be an alternative example to the RRAM circuit 50 in the example of FIG. 2.

The write circuit set portion 152 includes a P-channel metal-oxide semiconductor field-effect transistor (MOSFET, hereinafter "FET") $P_8$ having a source that is coupled to the power rail voltage $V_{DD}$ and a drain that is coupled to a node 158. The write circuit set portion 152 also includes a P-FET $P_9$ that interconnects the power rail voltage $V_{DD}$ and the resistive memory element 156, with the source of the P-FET $P_9$ being coupled to the power rail voltage $V_{DD}$ and the drain being coupled to a node 160. The gate of the P-FET $P_9$ is coupled to the node 158 having a voltage $V_G$, with the node 160 having a voltage $V_H$. The write circuit set portion 152 also includes a switch $SW_1$ that interconnects the node 158 and a node 162, and which is controlled by a signal $PLS_S$ that is provided during a write operation. The write circuit set portion 152 also includes a P-FET $P_{10}$ having a source that is coupled to the power rail voltage $V_{DD}$, and both a gate and a drain that are coupled to the node 162. A current source 164 interconnects the node 162 and the low voltage rail $V_{SS}$, and is configured to conduct a current $I_{LIM}$ from the node 162 to the low voltage rail $V_{SS}$.

The write circuit set portion 152 further includes an N-FET $N_8$ that interconnects the resistive memory element 156 via a node 168 at a drain and the low voltage rail $V_{SS}$ at a source, and which has a gate that is controlled by a write signal $WRT_S$ that is provided during the write operation. In the example of FIG. 4, the nodes 160 and 168 are labeled as "A" and "B" to indicate coupling to reset portions of each of the RRAM write circuit 14 and the write shutoff circuit 24, such that the resistive memory element 156 is likewise coupled to the reset portions of each of the RRAM write circuit 14 and the write shutoff circuit 24, such as the write circuit reset portion 102 and the write shutoff reset portion 104 in the example of FIG. 3.

The write shutoff reset portion 154 includes a P-FET $P_{11}$ having a source that is coupled to the power rail voltage $V_{DD}$, and which has a gate and drain that are coupled together at a node 170 having a voltage $V_I$. The node 170 is also coupled to a gate of the P-FET $P_8$, such that the P-FETs $P_8$ and $P_{11}$ are arranged as a current mirror. Thus, the P-FET $P_{11}$ is configured to conduct current concurrently with the P-FET $P_8$ in a proportional manner. The write shutoff reset portion 154 also includes a P-FET $P_{12}$ that interconnects the node 170 at a source and the node 160 at a drain, with a gate that is controlled by a set signal $SET_S$ that is provided during the write operation. The write shutoff reset portion 154 further includes a capacitor $C_3$ that likewise interconnects the nodes 160 and 170. As described herein, the capacitor $C_3$ is configured to react to a change in the write voltage $V_{WRT}$ over time ($dV_{WRT}/dt$) to provide deactivation of the write circuit set portion 152.

To implement a write operation, the set signal $SET_S$ can be asserted from a logic-low state to a logic-high state to deactivate the P-FET $P_{12}$. As a result, a conductive path between the nodes 160 and 170 through the P-FET $P_{12}$ is cut-off, and the capacitor $C_3$ is enabled to conduct current from the node 170 to the node 160. In addition, the signals $PLS_S$ and $WRT_S$ are also both asserted from a logic-low state to a logic-high state to activate the N-FET $N_8$ and the switch $SW_1$. The switch $SW_1$ pulls the voltage $V_G$ down to a voltage that causes the P-FET $P_{10}$ to conduct a current equivalent to the current $I_{LIM}$. The coupling of the node 158 and the node 162 thus causes the P-FETs $P_9$ and $P_{10}$ to operate as a current mirror, such that the P-FET $P_9$ is configured to conduct current concurrently with the P-FET $P_{10}$ in a proportional manner. In the example of FIG. 4, because the current flow through the P-FET $P_{10}$ is limited by the current $I_{LIM}$ generated by the current source 164, the current through the P-FET $P_9$, and thus also the resistive current element 154 is likewise limited to a proportion of the current $I_{LIM}$ (e.g., the amplitude of the current $I_{LIM}$). The N-FET $N_8$ thus provides a current path from the positive rail voltage $V_{DD}$ through the current-limited P-FET $P_9$, through the resistive memory element 156, and through the activated N-FET $N_8$ to the low voltage rail $V_{DD}$. Accordingly, the write voltage $V_{WRT}$ is provided across the resistive memory element 156.

In addition, because the voltages $V_H$ and $V_G$ are pulled down via the activation of the N-FET $N_8$ and the switch $SW_1$, respectively, the capacitor $C_3$ builds a charge via a current through the P-FET $P_{11}$ to provide a voltage difference between the voltages $V_I$ and $V_H$. Thus, while the switch $SW_1$ is activated, the P-FETs $P_8$ and $P_{11}$ conduct a current that is provided to through the capacitor $C_3$ to allow the voltage $V_H$ to settle to a voltage that is less than the positive rail voltage $V_{DD}$. As an example, the signal $PLS_S$ can be a pulsed signal, such that the signal $PLS_S$ can be de-asserted from the logic-high state to the logic-low state at a predetermined time later, such as after the charge across the capacitor $C_3$ settles and the voltage $V_H$ stabilizes, to deactivate the switch $SW_1$. The P-FETs $P_8$ and $P_{11}$ likewise deactivate in response to the setting of the voltages $V_H$ and $V_I$. The low voltage amplitude of the voltage $V_G$ can be stored in the parasitic gate capacitance of the P-FET $P_9$ subsequent to deactivation of the switch $SW_1$ to maintain activation of the P-FET $P_9$. Therefore, the write voltage $V_{WRT}$ is maintained across the resistive memory element 156 subsequent to deactivation of the switch $SW_1$.

At a subsequent time, the resistance of the resistive memory element 156 changes rapidly from a high-resistance state to a low-resistance state (e.g., is "set") to indicate the change in the binary state of the resistive memory element 156. As a result, the write voltage $V_{WRT}$ likewise rapidly decreases, which causes the voltage $V_H$ at the node 160 to also rapidly decrease. Therefore, the write voltage $V_{WRT}$ experiences a rapid change in amplitude over time ($dV_{WRT}/dt$), which is detected by the write shutoff reset portion 154. In the example of FIG. 4, the rapid decrease of the voltage $V_H$ causes the capacitor $C_3$ to generate a current pulse $I_{PLS}$. The current pulse $I_{PLS}$ can thus pull the voltage $V_I$ down to activate the P-FETs $P_8$ and $P_{11}$. The activation of the P-FET $P_8$ via the decrease of the voltage $V_I$ at the node 170 causes the voltage $V_G$ to be pulled up to approximately the amplitude of the positive rail voltage $V_{DD}$. Accordingly, the P-FET $P_9$ is deactivated to cease the current flow through the resistive memory element 156, and thus to cease the application of the write voltage $V_{WRT}$ to terminate the write operation. At a subsequent time later, the signals $WRT_S$ and $SET_S$ can be de-asserted to deactivate the N-FET $N_8$ and to activate the P-FET $P_{12}$, thus allowing the capacitor $C_3$ to discharge and returning the RRAM circuit 150 to return to a resting state.

Accordingly, the RRAM circuit 150 demonstrates another example of a manner for implementing a write operation, similar to as described previously regarding the example of FIG. 2. The current limit set by the voltage stored on the parasitic gate capacitance of the P-FET $P_9$ forces the current through the resistive memory element 156 to not exceed the limit, effectively setting a write-current compliance level. As described previously, the RRAM circuit 150 can be coupled to the RRAM circuit 100 via the nodes "A" and "B", similar to as described previously regarding the RRAM circuit 50 in the example of FIG. 2.

Figure 5:
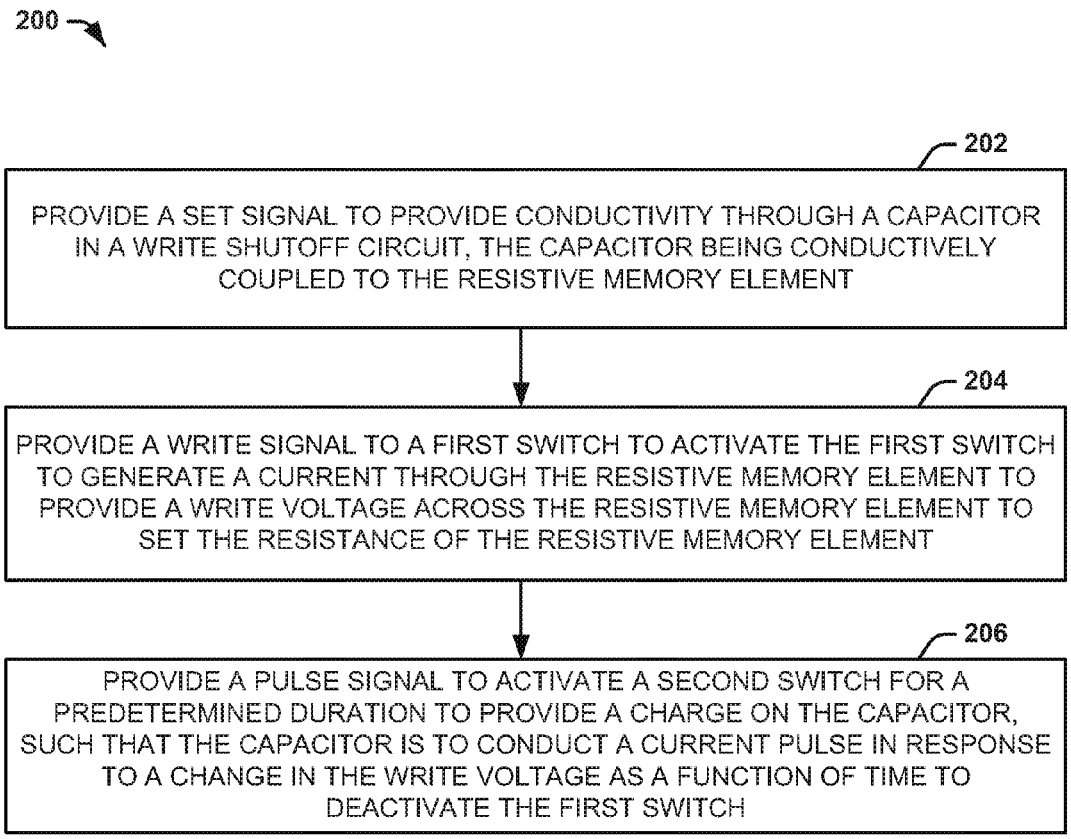
FIG. 5 illustrates an example of a method for writing a binary state to a resistive memory element of an RRAM system.

In view of the foregoing structural and functional features described above, an example methodology will be better appreciated with reference to FIG. 5. While, for purposes of simplicity of explanation, the methodology of FIG. 5 is shown and described as executing serially, it is to be understood and appreciated that the present invention is not limited by the illustrated order, as some embodiments could in other embodiments occur in different orders and/or concurrently from that shown and described herein.

FIG. 5 illustrates an example of a method 200 for writing a binary state to a resistive memory element (e.g., the resistive memory element 12) of an RRAM system (e.g., the RRAM system 10). At 202, a set signal (e.g., the set signal $SET_S$ or the set signal $SET_R$) is provided to provide conductivity through a capacitor (e.g., the capacitor $C_1$) in a write shutoff circuit (e.g., the write shutoff circuit 24), the capacitor being conductively coupled to the resistive memory element. At 204, a write signal (e.g., the write signal $WRT_S$ or the write signal $WRT_R$) is provided to a first switch (e.g., the P-FET $P_2$) to activate the first switch to generate a current through the resistive memory element to provide a write voltage (e.g., the write voltage $V_{WRT}$) across the resistive memory element to set the resistance of the resistive memory element. At 206, a pulse signal (e.g., the signal $PLS_S$ or the signal $PLS_R$) is provided to activate a second switch (e.g., the N-FET $N_1$) for a predetermined duration to provide a charge on the capacitor, such that the capacitor is to conduct a current pulse (e.g., the current pulse $I_{PLS}$) in response to a change in the write voltage as a function of time to deactivate the first switch.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A resistive random access memory (RRAM) system comprising:
    a resistive memory element to store a binary state based on a resistance of the resistive memory element;
    an RRAM write circuit to generate a current through the resistive memory element to provide a write voltage across the resistive memory element to set the resistance of the resistive memory element; and
    a write shutoff circuit to monitor a change in the write voltage as a function of time to deactivate the RRAM write circuit in response to a change in the binary state of the resistive memory element.

2. The system of claim 1, wherein the resistive memory element is a bipolar resistive memory element, wherein the RRAM write circuit comprises a set portion to provide the write voltage across the resistive memory element in a first polarity to set a first resistance of the resistive memory element corresponding to a first binary state and a reset portion to provide the write voltage across the resistive memory element in a second polarity to set a second resistance of the resistive memory element corresponding to a second binary state.

3. The system of claim 2, wherein the write shutoff circuit comprises a set portion to monitor a first change in the write voltage as a function of time to deactivate the set portion of the RRAM write circuit in response to a change from the first binary state to the second binary state of the resistive memory element and a reset portion to monitor a second change in the write voltage as a function of time to deactivate the reset portion of the RRAM write circuit in response to a change from the second binary state to the first binary state of the resistive memory element.

4. The system of claim 3, wherein each of the set portion and the reset portion of the write shutoff circuit comprises a capacitor to conduct a current pulse in response to the change in the write voltage as a function of time to deactivate the current through the resistive memory element to deactivate the RRAM write circuit.

5. The system of claim 1, wherein the write shutoff circuit comprises:
   a switch that is activated during a write operation to provide the current through the resistive memory element; and
   a capacitor that is coupled to the resistive memory element and is to deactivate the switch in response to the change in the binary state of the resistive memory element.

6. The system of claim 5, wherein the capacitor interconnects the resistive memory element and an input of a first transistor associated with the RRAM write circuit and a second transistor associated with the write shutoff circuit, the first and second transistors being arranged as a current-mirror, wherein the capacitor is arranged in series with the first transistor, and wherein the current-mirror is coupled to an input of the switch, such that the capacitor is to activate the first and second transistors in response to the change in the write voltage as a function of time to deactivate the switch.

7. The system of claim 5, wherein the RRAM write circuit comprises a transistor in series with a current source to generate a bias current, wherein the transistor and the switch are arranged as a current mirror to provide current limiting associated with the current through the resistive memory element during the write operation.

8. A method for writing a binary state to a resistive memory element of a resistive random access memory (RRAM) system, the method comprising:
   providing a set signal to provide conductivity through a capacitor in a write shutoff circuit, the capacitor being conductively coupled to the resistive memory element;
   providing a write signal to a first switch to activate the first switch to generate a current through the resistive memory element to provide a write voltage across the resistive memory element to set the resistance of the resistive memory element; and
   providing a pulse signal to activate a second switch for a predetermined duration to provide a charge on the capacitor, such that the capacitor is to conduct a current pulse in response to a change in the write voltage as a function of time to deactivate the first switch.

9. The method of claim 8, wherein the capacitor interconnects the resistive memory element and an input of a first transistor associated with the RRAM write circuit and a second transistor associated with the write shutoff circuit, the first and second transistors being arranged as a current-mirror, wherein the capacitor is arranged in series with the first transistor, and wherein the current-mirror is coupled to an input of the first switch, such that the capacitor is to activate the first and second transistors in response to the current pulse to deactivate the first switch.

10. The method of claim 8, wherein providing the pulse signal comprises providing the pulse signal to activate the second switch for a predetermined duration to provide the charge on the capacitor based on a current mirror that limits an amplitude of the current through the first switch.

11. The method of claim 8, wherein providing the set signal comprises providing a first set signal to provide conductivity through a first capacitor in the write shutoff circuit, wherein providing the write signal comprises providing a first write signal to the first switch to activate the first switch to generate a first current through the resistive memory element to provide a first write voltage across the resistive memory element to set a first resistance of the resistive memory element corresponding to a first binary state, and wherein providing the pulse signal comprises providing a first pulse signal to activate the second switch for a predetermined duration to provide the charge on the first capacitor.

12. The method of claim 11, the method further comprising:
   providing a second set signal to provide conductivity through a second capacitor in the write shutoff circuit, the second capacitor being conductively coupled to the resistive memory element;
   providing a second write signal to a third switch to activate the third switch to generate a second current through the resistive memory element in a polarity that is opposite the first current to provide a second write voltage across the resistive memory element in a polarity that is opposite the first voltage to set a second resistance of the resistive memory element corresponding to a second binary state; and
   providing a second pulse signal to activate a fourth switch for a predetermined duration to provide a charge on the second capacitor, such that the second capacitor is to conduct a second current pulse in response to a change in the second write voltage as a function of time to deactivate the third switch.

13. A resistive random access memory (RRAM) system comprising:
   a bipolar resistive memory element to store a binary state based on a resistance of the resistive memory element;
   an RRAM write circuit comprising:
      a set portion to generate a first current through the bipolar resistive memory element to provide a first write voltage across the bipolar resistive memory element in a first polarity to set a first resistance of the bipolar resistive memory element corresponding to a first binary state; and
      a reset portion to generate a second current through the bipolar resistive memory element to provide a second write voltage across the bipolar resistive memory element to set a second resistance of the bipolar resistive memory element corresponding to a second binary state; and
   a write shutoff circuit comprising:
      a set portion to monitor a change in the first write voltage as a function of time to deactivate the set portion of the RRAM write circuit in response to a change from the first binary state to the second binary state of the bipolar resistive memory element; and
      a reset portion to monitor a change in the second write voltage as a function of time to deactivate the reset portion of the RRAM write circuit in response to a change from the second binary state to the first binary state of the bipolar resistive memory element.

14. The system of claim 13, wherein each of the set portion and the reset portion of the write shutoff circuit comprises:
   a switch that is activated during a write operation to provide the respective one of the first and second currents through the bipolar resistive memory element; and
   a capacitor that is coupled to the bipolar resistive memory element and is to generate a current pulse in response to the change in the binary state of the bipolar resistive memory element to deactivate the switch to terminate the write operation.

15. The system of claim 13, wherein the set portion of the RRAM write circuit comprises:
- a switch that is activated during a write operation to provide the first current through the bipolar resistive memory element; and
- a transistor in series with a current source to generate a bias current, wherein the transistor and the switch are arranged as a current mirror to provide current limiting associated with the first current through the bipolar resistive memory element during the write operation.

* * * * *